(12) United States Patent
Chang et al.

(10) Patent No.: US 10,283,683 B1
(45) Date of Patent: May 7, 2019

(54) FILAMENT STRUCTURE AND LED LIGHT BULB HAVING THE SAME

(71) Applicant: BGT MATERIALS LIMITED, Manchester (GB)

(72) Inventors: Kuo-Hsin Chang, Chiayi (TW); Chung-Ping Lai, Hsinchu County (TW)

(73) Assignee: BGT Materials Limited (GB)

( * ) Notice: Subject to any disclaimer, the term of this patent is extended or adjusted under 35 U.S.C. 154(b) by 0 days.

(21) Appl. No.: 16/166,138

(22) Filed: Oct. 21, 2018

Related U.S. Application Data

(63) Continuation-in-part of application No. 16/053,801, filed on Aug. 3, 2018, which is a continuation-in-part of application No. 15/874,343, filed on Jan. 18, 2018, now Pat. No. 10,082,256.

(51) Int. Cl.
| | |
|---|---|
| *C10B 49/02* | (2006.01) |
| *F21K 9/90* | (2016.01) |
| *H01L 33/50* | (2010.01) |
| *F21K 9/232* | (2016.01) |
| *F21K 9/235* | (2016.01) |
| *H01L 25/075* | (2006.01) |

(52) U.S. Cl.
CPC ............ *H01L 33/508* (2013.01); *F21K 9/232* (2016.08); *F21K 9/235* (2016.08); *H01L 33/502* (2013.01); *H01L 33/507* (2013.01); *H01L 25/0753* (2013.01)

(58) Field of Classification Search
CPC ........ F21V 29/503; F21V 29/85; F21V 29/89; F21K 9/232; H01R 33/22; H01L 25/0753; F21Y 2115/10
See application file for complete search history.

(56) References Cited

U.S. PATENT DOCUMENTS

| | | | | |
|---|---|---|---|---|
| 5,510,174 | A * | 4/1996 | Litman | C08K 3/38 428/343 |
| 6,918,983 | B2 * | 7/2005 | Tobita | C09J 5/00 156/272.4 |
| 8,400,051 | B2 * | 3/2013 | Hakata | H01L 25/0753 313/110 |

(Continued)

FOREIGN PATENT DOCUMENTS

| | | |
|---|---|---|
| EP | 2535640 B1 | 3/2012 |
| EP | 3208514 B1 | 8/2017 |

*Primary Examiner* — Tracie Y Green

(57) ABSTRACT

An LED filament contains: a light transmissive substrate, at least one LED chip, a first electrode pin, a second electrode pin, a light emitting layer, and a phosphor layer. The phosphor layer packages the at least one LED chip, and the first electrode pin and the second electrode pin expose outside the phosphor layer. The light emitting layer is made of electromagnetic wave material of different radiation waves, the at least one LED chip produces excitation light source to excite the phosphor layer to illumine lights, and a part of the excitation light source of the at least one LED chip excites the light emitting layer to illuminate the lights after passing through the substrate. The part of the excitation light source excites phosphors of the light emitting layer to illuminate the lights toward the LED filament or the light emitting layer absorbs visible lights converted from infrared lights.

27 Claims, 7 Drawing Sheets

(56) References Cited

U.S. PATENT DOCUMENTS

| | | | | |
|---|---|---|---|---|
| 8,587,945 B1* | 11/2013 | Hartmann | .......... | H05K 7/20454 |
| | | | | 361/679.53 |
| 9,933,121 B2 | 4/2018 | Lai et al. | | |
| 2012/0133263 A1* | 5/2012 | Yang | ......................... | F21K 9/00 |
| | | | | 313/46 |
| 2013/0215625 A1* | 8/2013 | Takeuchi | .............. | F21V 23/001 |
| | | | | 362/363 |
| 2014/0362565 A1* | 12/2014 | Yao | ..................... | H01L 25/0753 |
| | | | | 362/223 |
| 2015/0323139 A1* | 11/2015 | Tseng | ..................... | F21K 9/232 |
| | | | | 362/650 |
| 2017/0347493 A1* | 11/2017 | Arai | ................... | H05K 7/20481 |

\* cited by examiner

FILAMENT STRUCTURE AND LED LIGHT BULB HAVING THE SAME

BACKGROUND OF THE INVENTION

This application is a Continuation-in-Part of application Ser. No. 16/053,801, filed on Aug. 3, 2018.

FIELD OF THE INVENTION

The present invention relates to a filament structure and light-emitting diode (LED) light bulb which enhances heat dissipation and reduces dark region.

DESCRIPTION OF THE PRIOR ART

An LED light bulb contains at least light-emitting diode light (LED) filament and at least one LED chip accommodated in the LED light bulb so as to replace an incandescent light bulb.

An LED light bulb and LED lighting bar capable of emitting light over 4 pi is disclosed in EP2535640 B1. The LED light bulb contains a LED light bulb shell, a core column with an exhaust tube, at least one LED light emitting strip with LED chips emitting 4π light, a driver, and an electrical connector. The LED light bulb shell is vacuum sealed with the core column so as to form a vacuum sealed chamber, which is filled with a gas having a low coefficient of viscosity and a high coefficient of thermal conductivity, wherein the LED light emitting strips fixed on the core column are housed in the vacuum sealed chamber, wherein the LED light emitting strip is in turn electrically connected to the driver, the electrical connector, the electrical connector used to be electrically connected to an external power supply, so as to light the LED light emitting strips. However, heat of the LED light bulb influences a service life of the LEDs badly.

A method of making a LED light bulb with the Graphene filament is disclosed in U.S. Pat. No. 9,933,121 B2 so as to enhance heat dissipation. The method contains steps of: A. providing a flexible substrate, wherein the flexible substrate is flexible printed circuit board (PCB); B. coating graphene-based heat dissipation ink on a back side of the flexible substrate; C. cutting the printed circuit board (PCB) on which a graphene-based heat dissipation film is coated to form plural Graphene filaments; D. fixing the plural Graphene filaments into a light bulb. The flexible substrate has copper lines formed on both sides thereof for electronic circuits and heat conduction, and LED chips are mounted on a front side of the flexible substrate. The graphene-based heat dissipation ink is coated on the back side of the flexible substrate before or after LED chips/phosphor molding and then is dried. In addition, the Graphene filaments are fixed in a bended or arched position.

A light-emitting diode filament lamp is disclosed in EP3208514 B1 and contains: a lamp cap, a transparent housing, at least one filament support, and at least one light-emitting diode (LED) filament. The lamp cap is electrically connected with an external power supply so as to supply power to the at least one LED filament, the transparent housing is hollow and includes an opening, wherein each filament support includes a first metal post electrically connected with a positive terminal and includes a second metal post electrically connected with a negative terminal so as to transmit driving power. Furthermore, each LED filament includes a first electrode pin electrically connected with the first metal post and includes a second electrode pin electrically connected with the second metal post, such that an LED drive circuit is defined any one of graphene, borazon (bn) and thermally conductive ceramic powders is coated on each of the first metal post and the second metal post so as to form a black body radiation layer, the at least one LED filament and the at least one filament support are housed in the transparent housing, and the opening is closed by the lamp cap.

However, the at least one LED filament disclosed in U.S. Pat. No. 9,933,121 B2 and EP3208514B1 produces dark region on the back face of the substrate.

The present invention has arisen to mitigate and/or obviate the afore-described disadvantages.

SUMMARY OF THE INVENTION

The primary aspect of the present invention is to provide a filament structure and light-emitting diode (LED) light bulb which enhances heat dissipation and reduces dark region.

To obtain the above aspect, an LED filament provided by the present invention contains: a light transmissive substrate, at least one LED chip connected on a front face of the substrate, a first electrode pin and a second electrode pin which are arranged on two sides of the substrate respectively and are serially connected with the at least one LED chip, a light emitting layer formed on a back face or the front face of the substrate, and a phosphor layer formed on the front face of the substrate.

The phosphor layer packages the at least one LED chip, and the first electrode pin and the second electrode pin expose outside the phosphor layer.

The light emitting layer is made of electromagnetic wave material of different radiation waves, the at least one LED chip produces excitation light source to excite the phosphor layer to illumine lights, and a part of the excitation light source of the at least one LED chip excites the light emitting layer to illuminate the lights after passing through the substrate, wherein the part of the excitation light source of the at least one LED chip excites phosphors of the light emitting layer to illuminate the lights toward the back face of the LED filament or the light emitting layer absorbs visible lights converted from infrared lights.

An LED light bulb contains: a transparent case, a screw base, a driver, at least one filament support, and at least one LED filament.

The transparent case includes a hollow cavity defined therein, an air tube communicating with the hollow cavity and an exterior of the transparent case.

The screw base is connected on a bottom of the transparent case, and the screw base includes a first power terminal and a second power terminal which are configured to electrically connect with an external power supply.

Each of the at least one LED filament is comprised of a light transmissive substrate, at least one LED chip connected on a front face of the substrate, a first electrode pin and a second electrode pin which are arranged on two sides of the substrate respectively and are serially connected with the at least one LED chip, a light emitting layer formed on a back face or the front face of the substrate, and a phosphor layer formed on the front face of the substrate.

The phosphor layer packages the at least one LED chip, and the first electrode pin and the second electrode pin expose outside the phosphor layer.

The light emitting layer is made of electromagnetic wave material of different radiation waves, the at least one LED chip produces excitation light source to excite the phosphor layer to illumine lights, and a part of the excitation light source of the at least one LED chip excites the light emitting layer to illuminate the lights after passing through the substrate, wherein the part of the excitation light source of the at least one LED chip excites phosphors of the light emitting layer to illuminate the lights toward the back face of the LED filament or the light emitting layer absorbs visible lights converted from infrared lights.

Preferably, the substrate is made of any one of ceramics, glass, sapphire, plastic, and paper.

Preferably, the substrate is made of any one of flexible ceramics, flexible glass, flexible plastic, and flexible paper.

Preferably, the light emitting layer is made of electromagnetic wave material, and the electromagnetic wave material is at least one of phosphors, thermal radiation powders, and upconversion materials, wherein the upconversion materials are configured to convert the infrared lights into the visible lights.

Preferably, the phosphors of the light emitting layer consist of at least one of aluminate phosphors, nitride phosphors, nitrogen oxide phosphors, silicate phosphors, fluoride phosphors, tin-sulfur alloy phosphors, and quantum dot phosphors.

Preferably, the thermal radiation powders of the light emitting layer consist of at least one of carbon materials, metal particles, ceramic powders, and heat radiation adhesive.

Preferably, the upconversion materials of the light emitting layer consists of at least one of halide material mixed with rare earth ion, fluorine compound material, fluorine oxide material, oxide material, sulfide material, silica, and phosphate.

Preferably, the upconversion materials of the light emitting layer 30 consists of at least one of fluorinated arsenic chloride-based glass, oxyfluoride glass (such as $Al_2O_3$+ $CdF_2$+$PbF_2$+$YF_3$), ZBLAN glass (such as $Nd_3Pb_5M_3F_{19}$: M=Al, Ti, V, Cr, Fe, Ga; $Ho_3$ $BaY_2F_8$; $Pr_3K_2YF_5$), $AlF_3$ based glass, alumina yttrium fluoride mixed with $ErF_3$, alumina zirconium fluoride glass mixed with $ErF_3$, Er3Cs3Lu2Br9 glass, GGSX (Pr3GeS2Ga2S3CsCl) glass, PGPNO ($Pr_3GeO_2PbONb_2O_5$) glass, Er3TeO glass, La2S3 glass, phosphate glass, Fluoro-Boric acid salt glass, and tellurium acid salt glass.

Preferably, the carbon materials of the thermal radiation powders consist of at least one of graphene, carbon black, graphite, carbon nanotubes, carbon-60, activated carbon, biochar, bamboo charcoal, and coal ash.

Preferably, the metal particles of the thermal radiation powders are any one of copper (Cu), nickel (Ni), zinc (Zn), iron (Fe), cobalt (Co), silver (Ag), gold (Au), platinum (Pt), and a mixture of the Cu, the Ni, the Zn, the Fe, the Co, the Ag, the Au, and the Pt.

Preferably, the ceramic powders of the thermal radiation powders consists of at least one of oxide ceramics, nitride ceramics, carbide ceramics, boride ceramics, telluride ceramics, silicide ceramics, fluoride ceramics, sulfide, and infrared-ray radiation powders.

Preferably, the heat radiation adhesive of the thermal radiation powders consists of at least one of silicone, acrylic resin, epoxy resin, polyurethane resin, and polyimide resin.

Preferably, the hollow cavity of the transparent case is closed at a low pressure or a normal pressure, and gas of low viscosity coefficient and high conductivity coefficient is filled into the hollow cavity, wherein the gas consists of at least one of Hydrogen (H2), helium (He), and argon (Ar).

Preferably, the hollow cavity of the transparent case is vacuumed or is at a low pressure of 0.01 MPa to 0.1 MPa.

BRIEF DESCRIPTION OF THE DRAWINGS

FIGS. 4-1 and 4-2 are a cross sectional view showing the operation of an LED filament according to another preferred embodiment of the present invention.

DETAILED DESCRIPTION OF THE PREFERRED EMBODIMENTS

Figure 1:
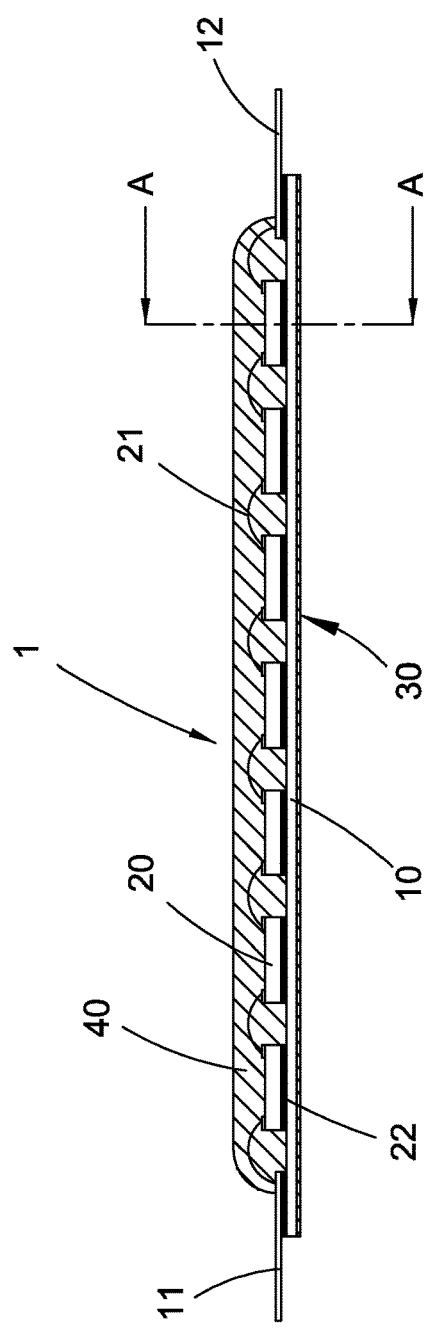
FIG. 1 is a cross sectional view showing the assembly of an LED filament according to a preferred embodiment of the present invention.

With reference to FIG. 1, an LED filament 1 according to a preferred embodiment of the present invention comprises: a light transmissive substrate 10, at least one LED chip 20 connected on a front face of the substrate 10, a first electrode pin 11 and a second electrode pin 12 which are arranged on two sides of the substrate 10 respectively and are serially connected with the at least one LED chip 20, and a light emitting layer 30 formed on a back face or the front face of the substrate 10, wherein the light emitting layer 30 is made of electromagnetic wave material (such as at least one of phosphors, thermal radiation powders, and upconversion materials, wherein the upconversion materials are configured to convert infrared lights into visible lights). The LED filament 1 further comprises a phosphor layer 40 formed on the front face of the substrate 10, for example, the phosphor layer 40 is made of fluorescent glue consisting of phosphors and is coated on the front face of the substrate 10, wherein the phosphor layer 40 packages the at least one LED chip 20, and the first electrode pin 11 and the second electrode pin 12 expose outside the phosphor layer 40.

Figure 3:
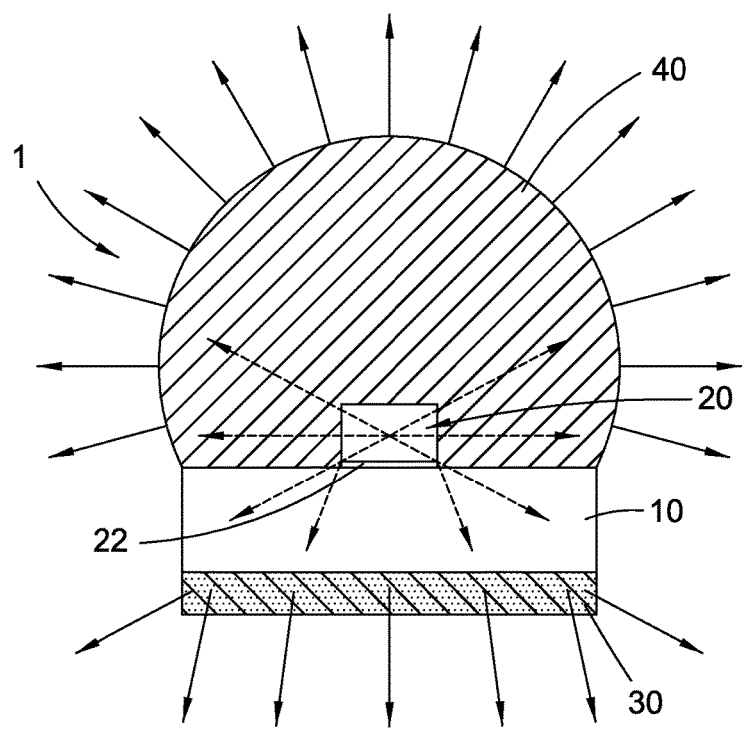
FIG. 3 is a cross sectional view showing the operation of the LED filament according to the preferred embodiment of the present invention.

Referring to FIG. 3, the at least one LED chip 20 produces excitation light source (such as blue lights denoted by a dotted line of FIG. 3) to excite the phosphor layer 40 to illumine lights (such as white lights represented by a solid light of FIG. 3), wherein a part of the excitation light source of the at least one LED chip 20 excites the light emitting layer 30 to illuminate the lights (such as the white lights represented by the solid light of FIG. 3) after passing through the substrate 10, wherein the part of the excitation light source of the at least one LED chip 20 excites the phosphors of the light emitting layer 30 to illuminate the lights toward the back face of the LED filament 1, thus reducing dark region of the LED filament 1. The thermal radiation powders of the light emitting layer 30 produces thermal radiation after being excited thermally so as to enhance heat dissipation of the LED filament 1. The upconversion materials of the light emitting layer 30 absorb the visible lights converted from the infrared lights so as to enhance the heat dissipation and to reduce the dark region of the LED filament 1.

The electromagnetic wave material is mixed with silicone and is coated on the back or front face in a gluing manner or a glue dispensing manner, such that the light emitting layer 30 is formed on the back face or the front face of the substrate 10.

In another embodiment, the electromagnetic wave material is sintered on the back or front face of the substrate 10.

Figure 2:
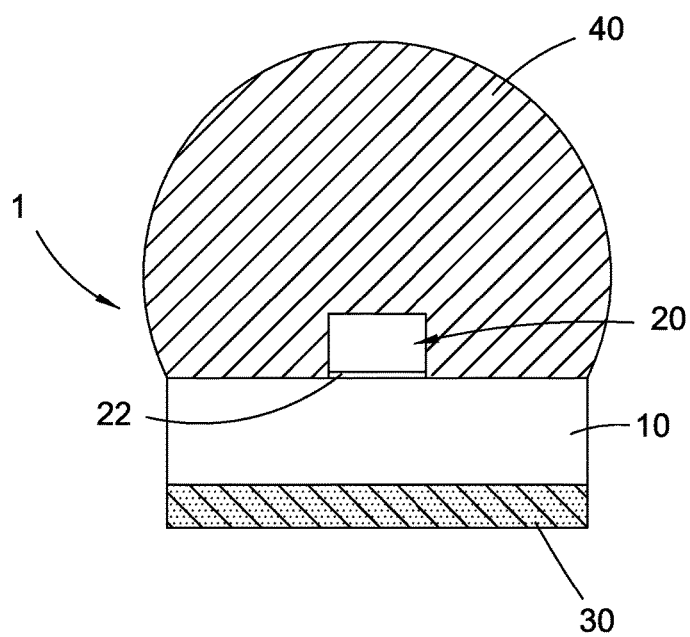
FIG. 2 is a cross sectional view taken along the line A-A of FIG. 1.
Figures 1, 4:
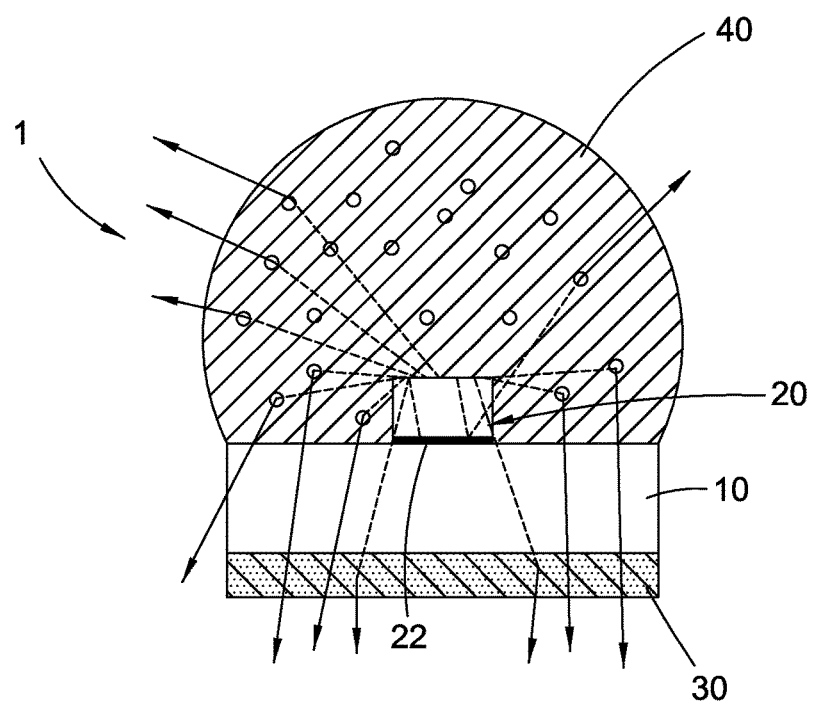
Figures 2, 4:
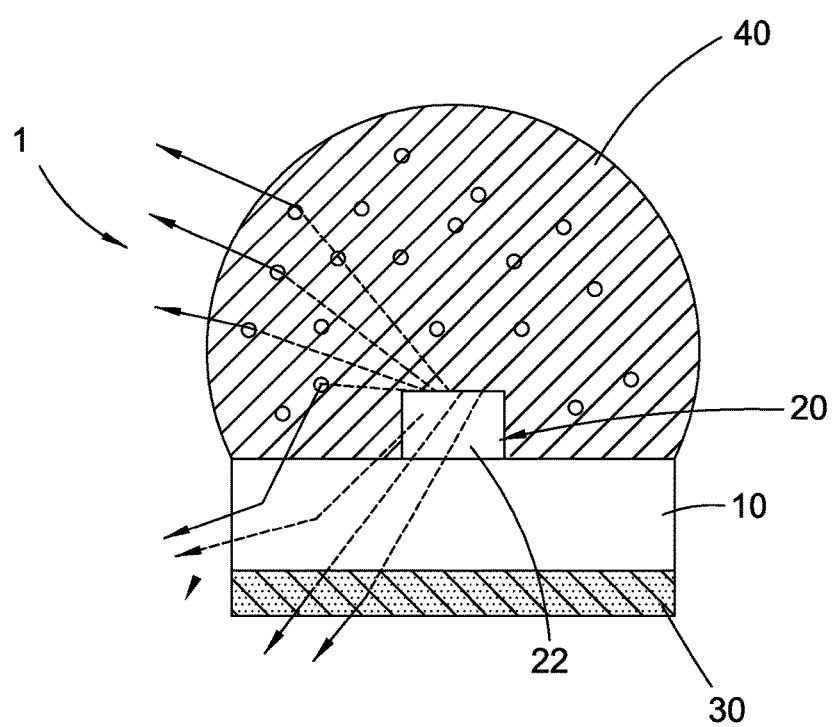

With reference to FIGS. 4-1 and 4-2, in another preferred embodiment, the at least one LED chip 20 is a back-plated chip and produces excitation light source (such as blue lights denoted by a dotted line of FIG. 4-1) to excite the phosphors of the phosphor layer 40 to illumine lights (such as white lights represented by a solid light of FIG. 4-1), wherein a part of the excitation light source of the at least one LED chip 20 excites the phosphors of the light emitting layer 30 to illuminate the lights after passing through the substrate 10. As shown in FIG. 4-2, the at least one LED chip 20 is a non-back-plated chip, wherein the at least one LED chip 20 produces the excitation light source (such as blue lights denoted by a dotted line of FIG. 4-1) to excite the phosphors of the phosphor layer 40 to illumine the lights (such as white lights represented by a solid light of FIG. 4-2), and a part of the excitation light source of the at least one LED chip 20 excites the phosphors of the light emitting layer 30 to illumine the lights after passing through the substrate 10.

Figure 6:
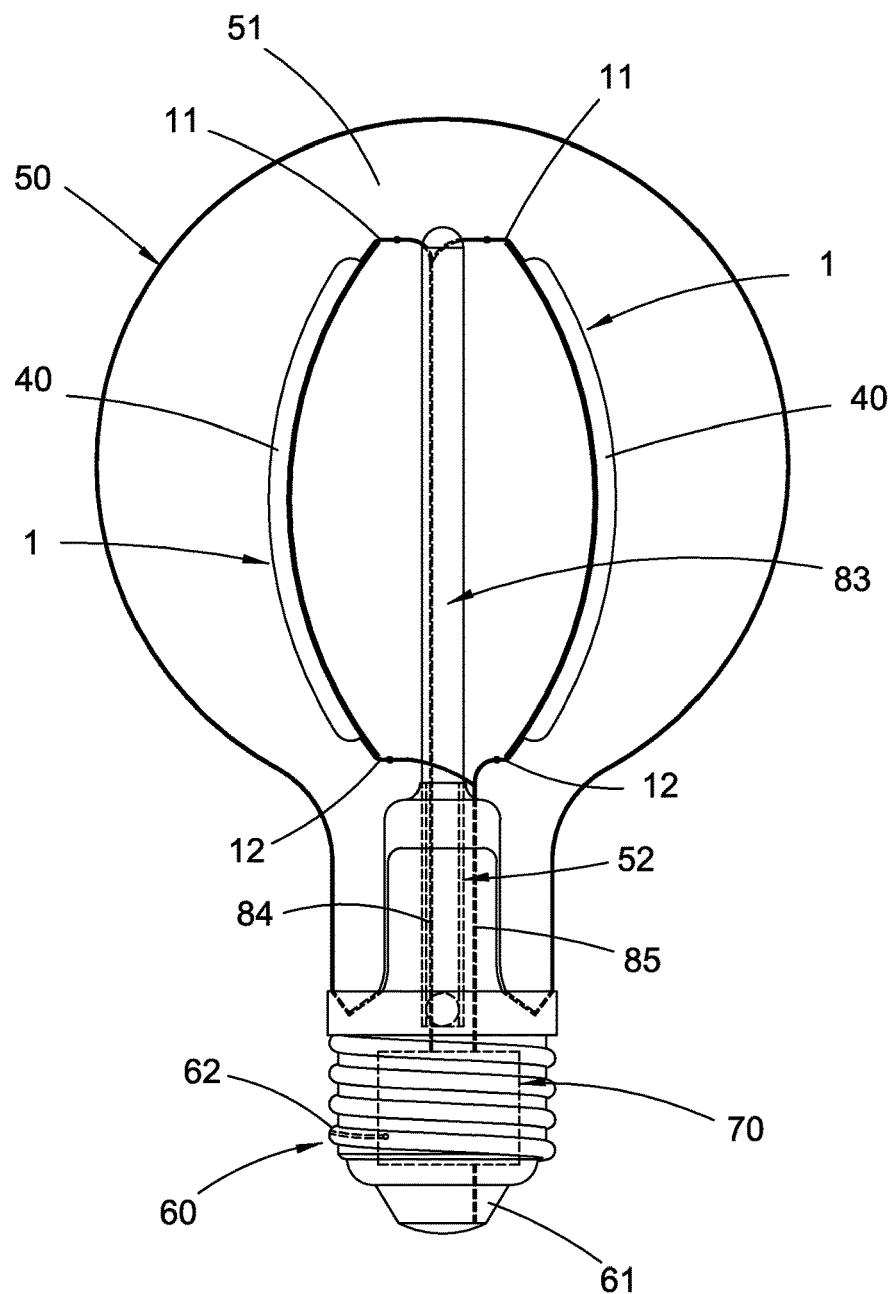
FIG. 6 is a cross sectional view showing the assembly of an LED light bulb according to another preferred embodiment of the present invention.

The substrate 10 is made of transparent or translucent material, such as any one of ceramics, glass, sapphire, plastic, and paper. In another embodiment, the substrate 10 is made of flexible material, such as any one of flexible ceramics, flexible glass, flexible plastic, and flexible paper, such that the LED filament 1 is flexible so as to be applicable for an LED light bulb having an arcuate housing 50 made of transparent material, as illustrated in FIG. 6.

The LED filament 1 includes multiple LED chips 20 which are serially connected, as shown in FIG. 1, wherein the multiple LED chips 20 are adhered on a front face of a light transmissive substrate 10 by ways of transparent die bond glue 22, wherein a metal conductive wire is serially connected between any two adjacent LED chips 20, and the multiple LED chips 20 are manufactured by using any one of horizontal LED structure, vertical LED structure, and flip chip LED structure, wherein a width of the multiple LED chips 20 is less than a width of a cross section of the substrate 10 so that the phosphor layer 40 on the front face of the substrate 10 covers the multiple LED chips 20 and the metal conductive wire, and a part of excitation light source of the multiple LED chips 20 excites the light emitting layer 30 to illuminate the lights after passing through the substrate 10.

The light emitting layer 30 is made of electromagnetic wave material (such as at least one of phosphors, thermal radiation powders, and upconversion materials, wherein the upconversion materials are configured to convert infrared lights into visible lights) of different radiation waves.

The phosphors of the light emitting layer 30 consist of at least one of aluminate phosphors, nitride phosphors, nitrogen oxide phosphors, silicate phosphors, fluoride phosphors, tin-sulfur alloy phosphors, and quantum dot phosphors.

The thermal radiation powders of the light emitting layer 30 consists of at least one of carbon materials, metal particles, ceramic powders, and heat radiation adhesive so as to produce different electromagnetic waves, hence heat from the LED filament 1 excites thermal radiation to enhance heat dissipation of the LED filament 1.

The upconversion materials of the light emitting layer 30 consists of at least one of halide material mixed with rare earth ion, fluorine compound material, fluorine oxide material, oxide material, sulfide material, silica, and phosphate. The upconversion materials of the light emitting layer 30 are excited by infrared-ray radiation to emit the visible lights, thus enhancing the heat dissipation of the LED filament 1.

The upconversion materials of the light emitting layer 30 consists of at least one of fluorinated arsenic chloride-based glass, oxyfluoride glass (such as $Al_2O_3+CdF_2+PbF_2+YF_3$), ZBLAN glass (such as $Nd_3Pb_5M_3F_{19}$: M=Al, Ti, V, Cr, Fe, Ga; $H_{O3}$ $BaY_2F_8$; $Pr_3K_2YF_5$), $AlF_3$ based glass, alumina yttrium fluoride mixed with $ErF_3$, alumina zirconium fluoride glass mixed with $ErF_3$, Er3Cs3Lu2Br9 glass, GGSX (Pr3GeS2Ga2S3CsCl) glass, PGPNO ($Pr_3GeO_2PbONb_2O_5$) glass, Er3TeO glass, La2S3 glass, phosphate glass, Fluoro-Boric acid salt glass, and tellurium acid salt glass.

The carbon materials of the thermal radiation powders consist of at least one of graphene, carbon black, graphite, carbon nanotubes, carbon-60, activated carbon, biochar, bamboo charcoal, and coal ash.

The metal particles of the thermal radiation powders are any one of copper (Cu), nickel (Ni), zinc (Zn), iron (Fe), cobalt (Co), silver (Ag), gold (Au), platinum (Pt), and a mixture of the Cu, the Ni, the Zn, the Fe, the Co, the Ag, the Au, and the Pt.

The ceramic powders of the thermal radiation powders consists of at least one of oxide ceramics, nitride ceramics, carbide ceramics, boride ceramics, telluride ceramics, silicide ceramics, fluoride ceramics, sulfide, and infrared-ray radiation powders.

The heat radiation adhesive of the thermal radiation powders consists of at least one of silicone, acrylic resin, epoxy resin, polyurethane resin, and polyimide resin.

Figure 5:
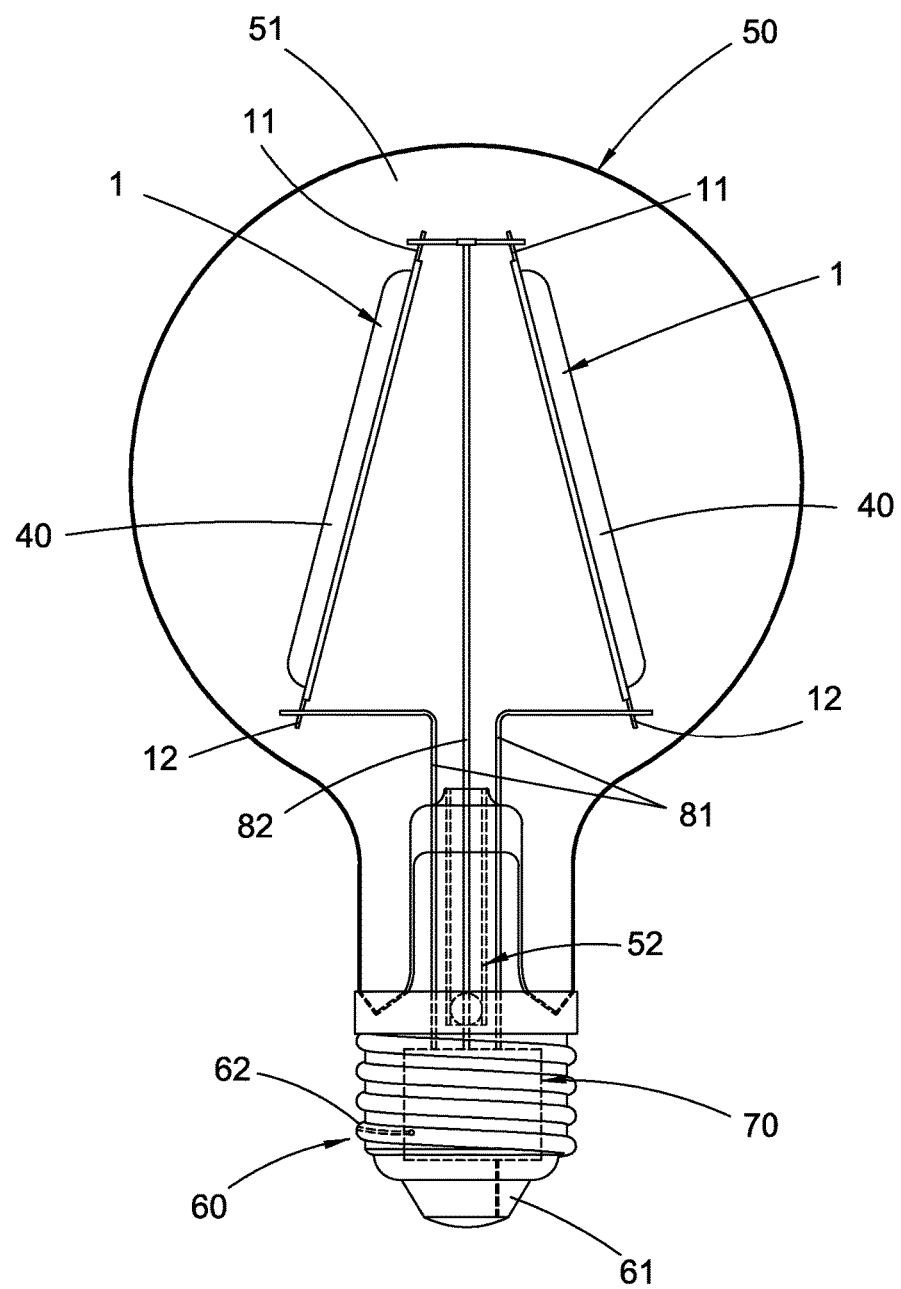
FIG. 5 is a cross sectional view showing the assembly of an LED light bulb according to a preferred embodiment of the present invention.

Referring to FIG. 5, in application, the LED light bulb includes a transparent case 50, a screw base 60, a driver 70, at least one filament support, and at least one LED filament 1.

The transparent case 50 includes a hollow cavity 51 defined therein, an air tube 52 communicating with the hollow cavity 51 and an exterior of the transparent case 50.

The screw base 60 is connected on a bottom of the transparent case 50, and the screw base 60 includes a first power terminal 61 and a second power terminal 62 which are configured to electrically connect with an external power supply, wherein the screw base 60 closes the air tube 52 of the transparent case 50. In another embodiment, the air tube 52 of the transparent case 50 is closed by a seal element.

The driver 70 is accommodated in the screw base 60 and is defined between the transparent case 50 and the screw base 60, wherein the driver 70 is electrically connected with the first electrode pin 11, the second electrode pin 12, the first power terminal 61, and the second power terminal 62 directly or indirectly. The driver 70 is configured to convert the external power supply into a driving power to drive the at least one LED filament 1.

The hollow cavity 51 of the transparent case 50 is vacuumed or is at a low pressure of 0.01 MPa to 0.1 MPa.

In another embodiment, the hollow cavity 51 of the transparent case 50 is closed at the low pressure or a normal pressure, and gas of low viscosity coefficient and high conductivity coefficient is filled into the hollow cavity, wherein the gas consists of at least one of Hydrogen (H2), helium (He), and argon (Ar) so as to increase thermal conductivity and a thermal radiation area, thus enhancing heat dissipation and thermal radiation effect.

The at least one filament support consist of two metal supporting elements 81, 82 passing through and connected with and the transparent case 50. The transparent case 50 is made of glass material or plastic material and is connected with the two metal supporting elements 81, 82, wherein two tops of the two metal supporting elements 81, 82 extend into the hollow cavity 51 of the transparent case 50 to electrically connect with the first electrode pin 11 and the second electrode pin 12 of the LED filament 1, and two bottoms of the two metal supporting elements 81, 82 are electrically connected with the driver 70 via the transparent case 50 so that the driver 70 is electrically connected with the first electrode pin 11 and the second electrode pin 12 of the LED filament 1 via the two metal supporting elements 81, 82.

As illustrated in FIG. 6, in another preferred embodiment, each of the at least one filament support includes a column 83 extending into the hollow cavity 51, and each filament support includes two metal cables 84, 85 passing through the column 83. The transparent case 50 is made of glass material or plastic material and includes the column 83 one-piece formed with the transparent case 50, wherein two metal cables 84, 85 pass through and are connected with the column 83, two bottoms of the two metal cables 84, 85 pass through the column 83 to electrically connect with the driver 70, and the two tops of the two metal cables 84, 85 extend into the hollow cavity 51 of the transparent case 50 to electrically connect with the first electrode pin 11 and the second electrode pin 12 of the LED filament 1 respectively.

While the preferred embodiments of the invention have been set forth for the purpose of disclosure, modifications of the disclosed embodiments of the invention as well as other embodiments thereof may occur to skilled in the art. Accordingly, the appended claims are intended to cover all embodiments which do not depart from the spirit and scope of the invention.

What is claimed is:

1. An LED filament comprising:
 a light transmissive substrate, at least one LED chip connected on a front face of the substrate, a first electrode pin and a second electrode pin which are arranged on two sides of the substrate respectively and are serially connected with the at least one LED chip, a light emitting layer formed on a back face or the front face of the substrate, and a phosphor layer formed on the front face of the substrate;
 wherein the phosphor layer packages the at least one LED chip, and the first electrode pin and the second electrode pin expose outside the phosphor layer;
 wherein the light emitting layer is made of electromagnetic wave material of different radiation waves, the at least one LED chip produces excitation light source to excite the phosphor layer to illumine lights, and a part of the excitation light source of the at least one LED chip excites the light emitting layer to illuminate the lights after passing through the substrate, wherein the part of the excitation light source of the at least one LED chip excites phosphors of the light emitting layer to illuminate the lights toward the back face of the LED filament or the light emitting layer absorbs visible lights converted from infrared lights.

2. The LED filament as claimed in claim 1, wherein the substrate is made of any one of ceramics, glass, sapphire, plastic, and paper.

3. The LED filament as claimed in claim 1, wherein the substrate is made of any one of flexible ceramics, flexible glass, flexible plastic, and flexible paper.

4. The LED filament as claimed in claim 1, wherein the light emitting layer is made of electromagnetic wave material, and the electromagnetic wave material is at least one of phosphors, thermal radiation powders, and upconversion materials, wherein the upconversion materials are configured to convert the infrared lights into the visible lights.

5. The LED filament as claimed in claim 4, wherein the phosphors of the light emitting layer consist of at least one of aluminate phosphors, nitride phosphors, nitrogen oxide phosphors, silicate phosphors, fluoride phosphors, tin-sulfur alloy phosphors, and quantum dot phosphors.

6. The LED filament as claimed in claim 4, wherein the thermal radiation powders of the light emitting layer consists of at least one of carbon materials, metal particles, ceramic powders, and heat radiation adhesive.

7. The LED filament as claimed in claim 4, wherein the upconversion materials of the light emitting layer consists of at least one of halide material mixed with rare earth ion, fluorine compound material, fluorine oxide material, oxide material, sulfide material, silica, and phosphate.

8. The LED filament as claimed in claim 6, wherein the carbon materials of the thermal radiation powders consist of at least one of graphene, carbon black, graphite, carbon nanotubes, carbon-60, activated carbon, biochar, bamboo charcoal, and coal ash.

9. The LED filament as claimed in claim 6, wherein the metal particles of the thermal radiation powders are any one of copper (Cu), nickel (Ni), zinc (Zn), iron (Fe), cobalt (Co), silver (Ag), gold (Au), platinum (Pt), and a mixture of the Cu, the Ni, the Zn, the Fe, the Co, the Ag, the Au, and the Pt.

10. The LED filament as claimed in claim 6, wherein the ceramic powders of the thermal radiation powders consists of at least one of oxide ceramics, nitride ceramics, carbide ceramics, boride ceramics, telluride ceramics, silicide ceramics, fluoride ceramics, sulfide, and infrared-ray radiation powders.

11. The LED filament as claimed in claim 6, wherein the heat radiation adhesive of the thermal radiation powders consists of at least one of silicone, acrylic resin, epoxy resin, polyurethane resin, and polyimide resin.

12. The LED filament as claimed in claim 7, wherein the upconversion materials of the light emitting layer 30 consists of at least one of fluorinated arsenic chloride-based glass, oxyfluoride glass (such as $Al_2O_3+CdF_2+PbF_2+YF_3$), ZBLAN glass (such as $Nd_3Pb_5M_3F_{19}$: M=Al, Ti, V, Cr, Fe, Ga; $H_{O3}$ $BaY_2F_8$; $Pr_3K_2YF_5$), $AlF_3$ based glass, alumina yttrium fluoride mixed with $ErF_3$, alumina zirconium fluoride glass mixed with $ErF_3$, Er3Cs3Lu2Br9 glass, GGSX (Pr3GeS2Ga2S3CsCl) glass, PGPNO ($Pr_3GeO_2PbONb_2O_5$) glass, Er3TeO glass, La2S3 glass, phosphate glass, Fluoro-Boric acid salt glass, and tellurium acid salt glass.

13. An LED light bulb comprising: a transparent case, a screw base, a driver, at least one filament support, and at least one LED filament;
 the transparent case including a hollow cavity defined therein, an air tube communicating with the hollow cavity and an exterior of the transparent case;
 the screw base being connected on a bottom of the transparent case, and the screw base including a first power terminal and a second power terminal which are configured to electrically connect with an external power supply;
 each of the at least one LED filament comprised of a light transmissive substrate, at least one LED chip connected on a front face of the substrate, a first electrode pin and a second electrode pin which are arranged on two sides of the substrate respectively and are serially connected with the at least one LED chip, a light emitting layer formed on a back face or the front face of the substrate, and a phosphor layer formed on the front face of the substrate;

wherein the phosphor layer packages the at least one LED chip, and the first electrode pin and the second electrode pin expose outside the phosphor layer;

wherein the light emitting layer is made of electromagnetic wave material of different radiation waves, the at least one LED chip produces excitation light source to excite the phosphor layer to illumine lights, and a part of the excitation light source of the at least one LED chip excites the light emitting layer to illuminate the lights after passing through the substrate, wherein the part of the excitation light source of the at least one LED chip excites phosphors of the light emitting layer to illuminate the lights toward the back face of the LED filament or the light emitting layer absorbs visible lights converted from infrared lights.

14. The LED light bulb as claimed in claim 13, wherein the hollow cavity of the transparent case is vacuumed.

15. The LED light bulb as claimed in claim 13, wherein the hollow cavity of the transparent case is at a low pressure of 0.01 MPa to 0.1 MPa.

16. The LED light bulb as claimed in claim 13, wherein the hollow cavity of the transparent case is closed at a low pressure or a normal pressure, and gas of low viscosity coefficient and high conductivity coefficient is filled into the hollow cavity, wherein the gas consists of at least one of Hydrogen (H2), helium (He), and argon (Ar).

17. The LED light bulb as claimed in claim 13, wherein the substrate is made of any one of ceramics, glass, sapphire, plastic, and paper.

18. The LED light bulb as claimed in claim 13, wherein the substrate is made of any one of flexible ceramics, flexible glass, flexible plastic, and flexible paper.

19. The LED light bulb as claimed in claim 13, wherein the light emitting layer is made of electromagnetic wave material, and the electromagnetic wave material is at least one of phosphors, thermal radiation powders, and upconversion materials, wherein the upconversion materials are configured to convert the infrared lights into the visible lights.

20. The LED light bulb as claimed in claim 19, wherein the phosphors of the light emitting layer consist of at least one of aluminate phosphors, nitride phosphors, nitrogen oxide phosphors, silicate phosphors, fluoride phosphors, tin-sulfur alloy phosphors, and quantum dot phosphors.

21. The LED light bulb as claimed in claim 19, wherein the thermal radiation powders of the light emitting layer consists of at least one of carbon materials, metal particles, ceramic powders, and heat radiation adhesive.

22. The LED light bulb as claimed in claim 19, wherein the upconversion materials of the light emitting layer consists of at least one of halide material mixed with rare earth ion, fluorine compound material, fluorine oxide material, oxide material, sulfide material, silica, and phosphate.

23. The LED light bulb as claimed in claim 21, wherein the carbon materials of the thermal radiation powders consist of at least one of graphene, carbon black, graphite, carbon nanotubes, carbon-60, activated carbon, biochar, bamboo charcoal, and coal ash.

24. The LED light bulb as claimed in claim 21, wherein the metal particles of the thermal radiation powders are any one of copper (Cu), nickel (Ni), zinc (Zn), iron (Fe), cobalt (Co), silver (Ag), gold (Au), platinum (Pt), and a mixture of the Cu, the Ni, the Zn, the Fe, the Co, the Ag, the Au, and the Pt.

25. The LED light bulb as claimed in claim 21, wherein the ceramic powders of the thermal radiation powders consists of at least one of oxide ceramics, nitride ceramics, carbide ceramics, boride ceramics, telluride ceramics, silicide ceramics, fluoride ceramics, sulfide, and infrared-ray radiation powders.

26. The LED light bulb as claimed in claim 21, wherein the heat radiation adhesive of the thermal radiation powders consists of at least one of silicone, acrylic resin, epoxy resin, polyurethane resin, and polyimide resin.

27. The LED light bulb as claimed in claim 22, wherein the upconversion materials of the light emitting layer 30 consists of at least one of fluorinated arsenic chloride-based glass, oxyfluoride glass (such as $Al_2O_3+CdF_2+PbF_2+YF_3$), ZBLAN glass (such as $Nd_3Pb_5M_3F_{19}$: M=Al, Ti, V, Cr, Fe, Ga; $H_{O3}$ $BaY_2F_8$; $Pr_3K_2YF_5$), $AlF_3$ based glass, alumina yttrium fluoride mixed with $ErF_3$, alumina zirconium fluoride glass mixed with $ErF_3$, Er3Cs3Lu2Br9 glass, GGSX (Pr3GeS2Ga2S3CsCl) glass, PGPNO ($Pr_3GeO_2PbONb_2O_5$) glass, Er3TeO glass, La2S3 glass, phosphate glass, Fluoro-Boric acid salt glass, and tellurium acid salt glass.

* * * * *